(12) United States Patent
Millet

(10) Patent No.: US 7,834,722 B2
(45) Date of Patent: Nov. 16, 2010

(54) RF MEMS SWITCH WITH A FLEXIBLE AND FREE SWITCH MEMBRANE

(75) Inventor: Olivier Millet, Tiercelet (FR)

(73) Assignee: Delfmems, Villeneuve d'Aseq (FR)

( * ) Notice: Subject to any disclaimer, the term of this patent is extended or adjusted under 35 U.S.C. 154(b) by 260 days.

(21) Appl. No.: 11/886,684

(22) PCT Filed: Mar. 7, 2006

(86) PCT No.: PCT/EP2006/002076

§ 371 (c)(1),
(2), (4) Date: Nov. 9, 2007

(87) PCT Pub. No.: WO2006/099945

PCT Pub. Date: Sep. 28, 2006

(65) Prior Publication Data

US 2008/0237024 A1    Oct. 2, 2008

(30) Foreign Application Priority Data

Mar. 21, 2005   (EP) .................................. 05370005

(51) Int. Cl.
*H01H 51/22* (2006.01)
(52) U.S. Cl. ......................................... 335/78; 200/181
(58) Field of Classification Search ................... 335/78; 200/181

See application file for complete search history.

(56) References Cited

U.S. PATENT DOCUMENTS

| | | | |
|---|---|---|---|
| 6,717,496 B2 * | 4/2004 | Feng et al. | 335/78 |
| 7,164,334 B2 * | 1/2007 | Shirakawa | 335/78 |
| 7,342,472 B2 * | 3/2008 | Charvet | 335/78 |
| 7,348,870 B2 * | 3/2008 | Hsu et al. | 335/78 |
| 2004/0050674 A1 | 3/2004 | Rubel | |
| 2004/0113727 A1 | 6/2004 | Kawai | |
| 2005/0001701 A1 | 1/2005 | Shirakawa | |
| 2005/0068128 A1 | 3/2005 | Yip | |
| 2007/0188846 A1 * | 8/2007 | Slicker et al. | 359/290 |

FOREIGN PATENT DOCUMENTS

| | | | |
|---|---|---|---|
| EP | 1 429 413 A1 | 6/2004 | |
| EP | 1 489 639 A1 | 12/2004 | |

\* cited by examiner

*Primary Examiner*—Elvin G Enad
*Assistant Examiner*—Bernard Rojas
(74) *Attorney, Agent, or Firm*—Harness, Dickey & Pierce, P.L.C.

(57) ABSTRACT

The RF MEMS switch comprising micromechanical switching means that are carried by a substrate (1) and that can be actuated between two positions: a first position (off-state/FIG. 1) and a second position (on-state), and actuation means for actuating the position of the switching means. The micromechanical switching means comprise a flexible membrane (6) which is freely supported by support means (3), which is bendable under the action of the actuation means (7), and which can freely slide relatively to the support means (3) during its bending movement.

21 Claims, 4 Drawing Sheets

RF MEMS SWITCH WITH A FLEXIBLE AND FREE SWITCH MEMBRANE

CROSS-REFERENCE TO RELATED APPLICATIONS

Figure 1:
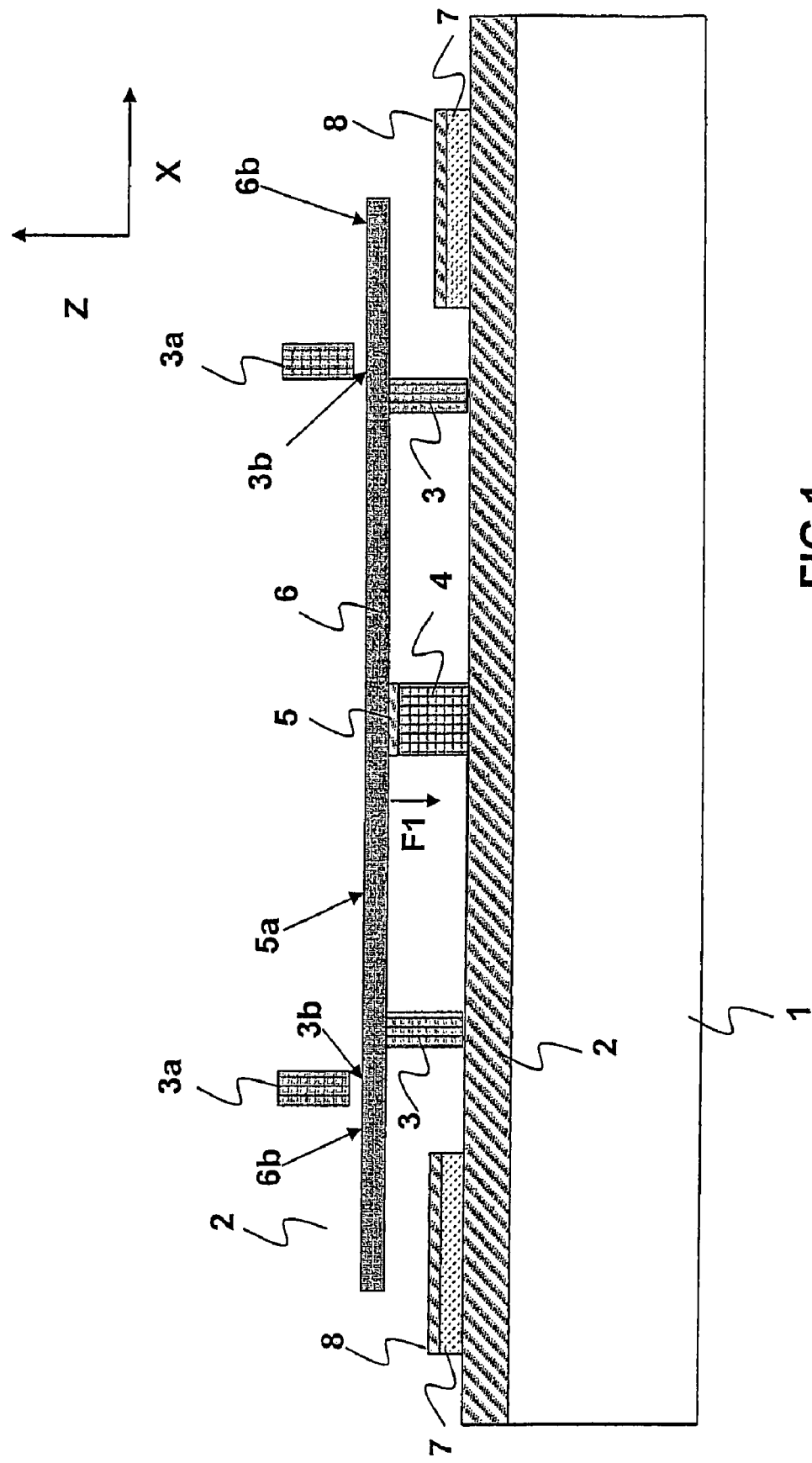

This application is a U.S. National Stage Application of International Application No. PCT/EP2006/002076, filed Mar. 7, 2006, and published in English as WO 2006/099945 A1 on Sep. 28, 2006. This application claims the benefit of EP application Ser. No. 05370005.0, filed Mar. 21, 2005. The disclosures of the above applications are incorporated herein by reference.

TECHNICAL FIELD

The present invention relates to the technical field of Radio Frequency (RF) switches implemented by Micro Electromechanical Systems (MEMS).

PRIOR ART

Micro Electromechanical Systems (MEMS) switches are now widely used in Radio Frequency (RF) communication systems such as for example phased array antennas, phase shifters, switchable tuning components, etc.

RF MEMS switches are essentially miniature devices that use a mechanical movement which is electrically actuated in order to achieve a short circuit or an open circuit in a RF transmission line. A RF MEMS switch thus essentially comprises two distinct means:

- micromechanical means that will be generally referred as "switching means" and that can be moved into two different positions: an off-position corresponding to the off-state of the switch, i.e. a state wherein the transmission line is opened and can not be used for transmitting a RF signal, and an on-position corresponding to the on-state of the switch, i.e. a state wherein the transmission line is "closed" and can be used for transmitting a RF signal
- electric means that will be generally referred as "actuation means" said electric actuation means are generally used for generating a force that is applied onto the mechanical switching means in order to move the latter into their on-position and/or into their off-position.

MEMS RF switches can be classified into several categories based on the electric actuations means used i.e. electrostatic, electromagnetic, piezoelectric, or electrothermal actuation means. Electrostatic actuation is the prevalent technique in use to date, since it enables to reach shorter switching times (typically less than 200 µs) and a virtually zero power consumption. Furthermore, in RF MEMS switch designs, different actuation techniques can be combined (for example an electrostatic voltage hold can be coupled with a thermal actuation).

MEMS RF switches can also be classified into two categories based on the contact used for switching the transmission line, i.e. "metal to metal contact switch" or a "capacitive contact switch". So-called metal to metal contact switches (also referred as "ohmic contact switches") are typically used for switching signal from DC to 60 GHz. Capacitive switches are more particularly used for switching RF signals between 6 GHz-120 GHz.

To date, MEMS RF switches can also be classified into two main categories based on the structure of their micromechanical switching means.

A first main category comprises RF MEMS switches whose micromechanical switching means comprise a flexible membrane that is anchored onto a substrate of the switch. A second category comprises RF MEMS switches whose micromechanical switching means comprise a stress-free rigid beam that is freely mounted onto the substrate of the switch.

RF MEMS having a flexible anchored membrane

In a first configuration, the flexible membrane is anchored onto the substrate at both extremities and is thus forming a bridge. MEMS switches using a flexible bridge as switching element are disclosed for example in the following publications: US patent application No 2004/0091203, U.S. Pat. No. 6,621,387, European patent application EP 1 343 189, PCT application WO 2004/076341.

In a second configuration, the flexible membrane is anchored onto the substrate only at one extremity, and is thus forming a cantilever. MEMS switches using a flexible cantilever membrane as switching element are disclosed for example in U.S. Pat. No. 5,638,946.

The use of RF MEMS switches having a flexible anchored membrane (bridge or cantilever) as switch element encounters the main following drawbacks. These switches are very sensible to temperature variations and to mechanical and/or thermal deformation of the substrate (first main drawback). During actuation, when the anchored switch membrane is deformed under the force generated by the actuation means, the said membrane is subjected to high mechanical stress, which in turn dramatically decreases the lifetime of the RF MEMS switch (second main drawback).

RF MEMS switches having a stress-free and rigid beam

RF MEMS switches having a stress-free and rigid beam are for example disclosed in European patent application EP 1489 639. In this publication, the switch element is a rigid beam that can freely move between both on-position and off-position in a plane that is parallel to the substrate. In another variant, the rigid beam can be a floating beam that can freely move between both on-position and off-position in a direction that is perpendicular to the substrate.

This type of switch advantageously overcomes the aforesaid drawbacks of RF MEMS switches having an anchored switching membrane. In return, these RF MEMS switches with a stress-free and rigid switch beam have a longer switching time (i.e. time that is necessary for moving the switch beam between on-position and off-position). Furthermore they are more sensible to mechanical shocks or vibrations.

OBJECTIVES OF THE INVENTION

A main objective of the invention is to propose a novel structure for a RF MEMS switch.

A further objective of the invention is to propose a novel RF MEMS switch that overcomes the aforesaid drawbacks of the RF MEMS switches using an anchored switch membrane.

A further objective of the invention is to propose a novel RF MEMS switch that has a short switching time, in comparison with the aforesaid RF MEMS switches having a stress-free and rigid switch beam.

A further objective of the invention is to propose a novel RF MEMS switch that is less sensible to mechanical shocks or vibrations in comparison with the aforesaid RF MEMS switches having a stress-free and rigid switch beam.

SUMMARY OF THE INVENTION

At least the above main objective is achieved by the RF MEMS switch of claim 1.

The RF MEMS switch of the invention comprises:
- micromechanical switching means that can be actuated between two positions: a first position (off state) and a second position (on state), and
- actuation means for actuating the position of the switching means.

According to one main novel feature of the invention, the micromechanical switching means comprise a flexible membrane which is freely supported by support means, which is bendable under the action of the actuation means, and which can freely slide relatively to the support means (3) during its bending movement.

The wording "freely supported" used therein (in the description and in the claims) means that the switch membrane can freely slide relatively to the supports means during the switching movement of the membrane between the off-position and on-position.

SHORT DESCRIPTION OF THE DRAWINGS

Figure 2:
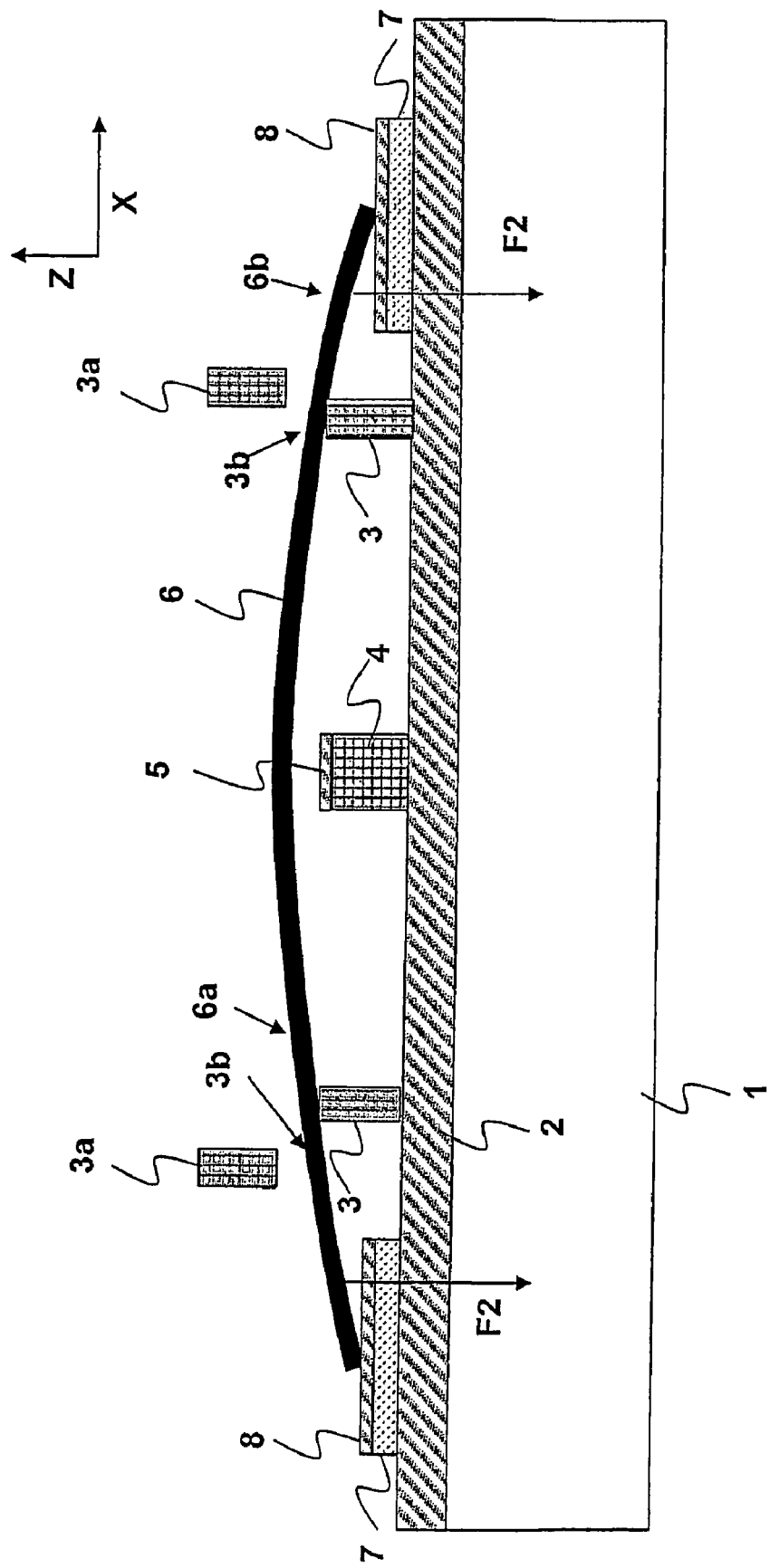
Figure 3:
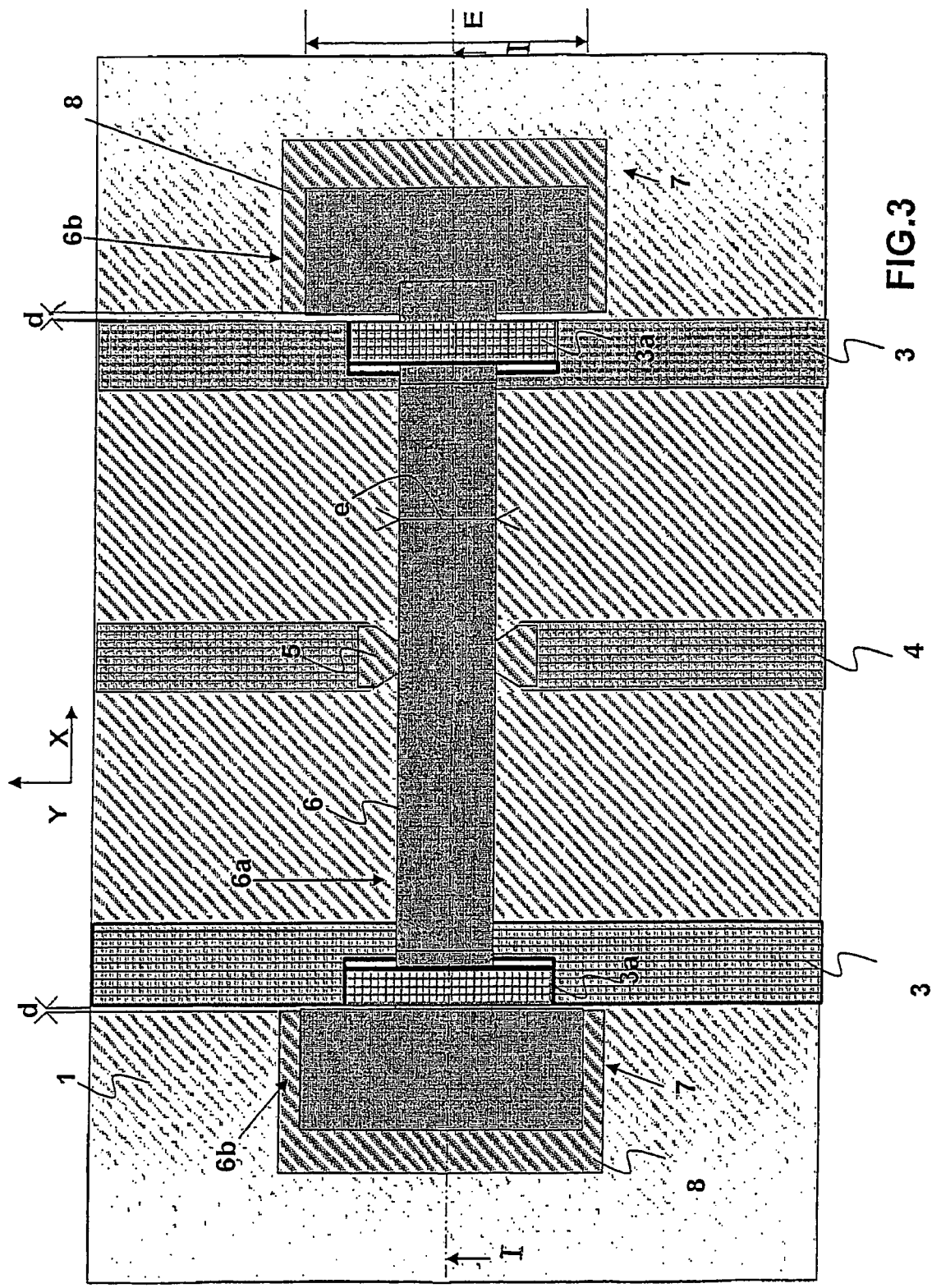
Figure 4:
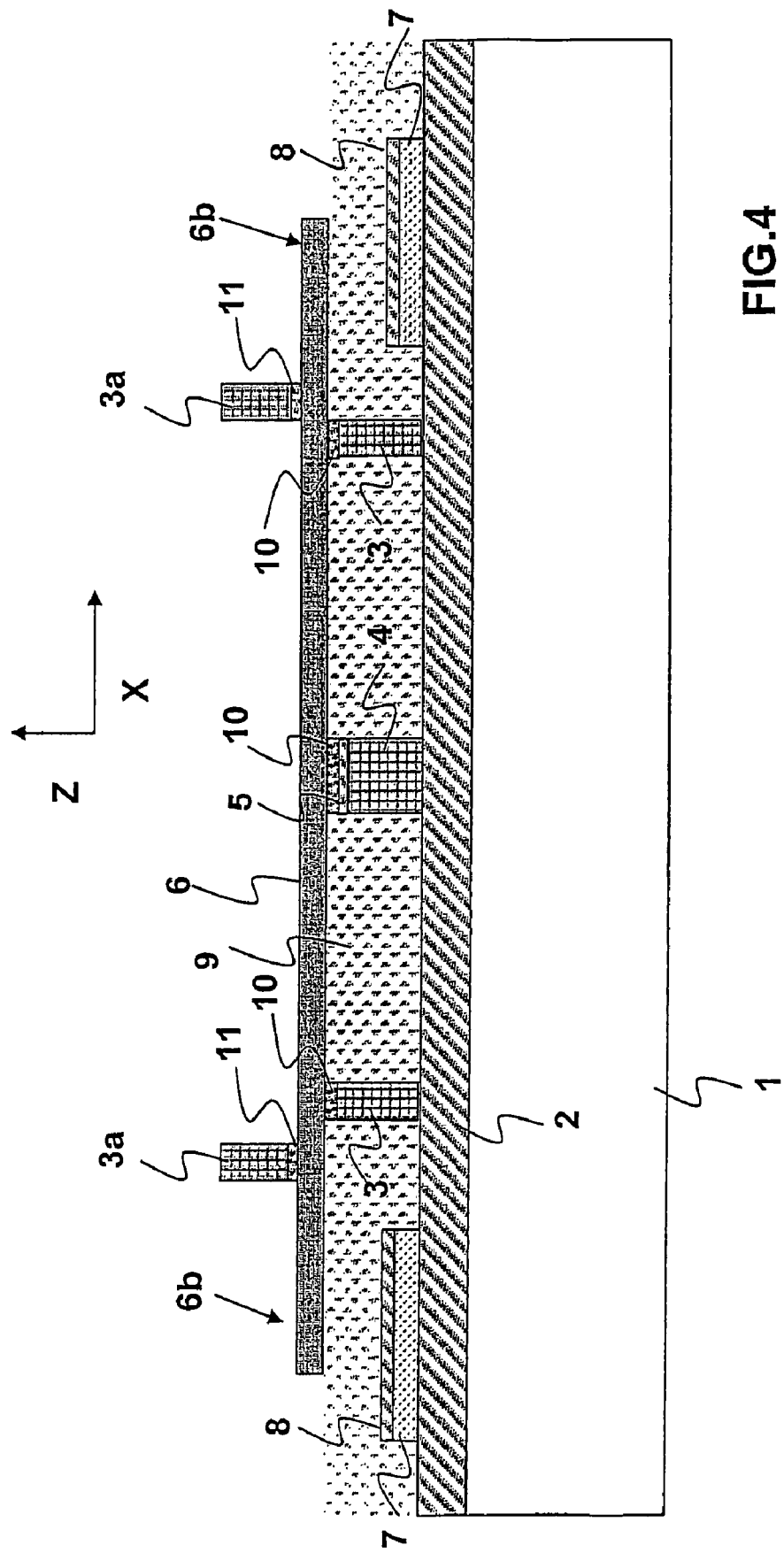

Other characteristics and advantages of the invention will appear more clearly on reading the following detailed description which is made by way of non-exhaustive and non-limiting example, and with reference to the accompanying drawings on which:

FIG. 1 is section view (in plane I-I of FIG. 3) of a capacitive RF MEMS switch of the invention, the switch being in the off-state, FIG. 2 is a section view of the switch of FIG. 1, the switch being in the on-state, FIG. 3 is a top view of the capacitive RF MEMS switch of figure and, FIG. 4 is a section view of the switch during the manufacturing process, and just before the final releasing step.

DETAILED DESCRIPTION

FIGS. 1 to 3 show a capacitive RF MEMS switch that is made according to preferred embodiment of the invention. For sake of clarity, it must however be underlined that the scope of the invention is not limited to a capacitive RF MEMS switch but encompasses also ohmic contact RF MEMS switches. The capacitive RF MEMS switch of FIGS. 1 to 3 has a novel structure that is now going to be detailed, and can be manufactured by using conventional surface micromachining technologies.

Referring to FIG. 1, the RF MEMS switch comprises a wafer 1 (for example made of silicium) forming the substrate of the switch. A thin dielectric layer 2 is deposited onto the surface of said wafer 1. On the dielectric layer 2, the switch comprises:
- two spaced-apart and parallel lateral supporting members 3, that extend in the transverse direction of FIG. 1 (see FIG. 3—direction Y).
- one central supporting member 4 that extends in a direction substantially parallel to the main direction of lateral supporting members 3 (i.e. in the transverse direction of FIG. 1—see FIG. 3), the said central supporting member 4 being disposed between the two lateral supporting members 3, and preferably at the centre between lateral supporting members 3.

In contrast with the lateral supporting members 3, the top surface of the central supporting member 4 is covered by a thin dielectric layer 5.

The two lateral supporting members 3 and the dielectric layer 2 form a Coplanar Waveguide (CPW), the two lateral supporting members 3 corresponding to the ground lines. The central supporting member 4 forms the signal line for the transmission of the RF electric signal within the coplanar wave guide (CPW).

The lateral and central supporting members 3, 4 are for example made of a metal such as gold. The dielectric material for layers 2 and 5 can be any material, and notably polymer, with a very low electrical conductivity. For example, the dielectric layers 2 and 5 are made of silicon nitride.

The RF MEMS switch further comprises a capacitive switch element which is constituted by a thin flexible membrane 6 made of a metal for example such as aluminium, gold, or any conductive alloy. The flexible switch membrane 6 is freely supported at least by the lateral supporting members 3.

Referring to FIG. 3, the flexible switch membrane 6 has a main central part 6a and two opposite extremities in the form of plates 6b. In the particular embodiment of the figures, the central part 6a is rectangular, and extends in the lateral direction (X) above the lateral supporting members 3. The plates 6b have a dimension (E) taken in the longitudinal direction (Y) of the supporting members 3 that is greater than the width (e) of the rectangular part 6a. The shape of the flexible membrane 6 is not important for the invention.

Each supporting members 3 further includes on its top part a bridge part 3a forming a passage 3b trough which the central part 6a of the membrane is freely positioned. The plates 6b of the membranes in combination of the bridge parts 3a are used as fastening means for maintaining the membrane on the supporting member 3 but without hindering the membrane 6 from freely moving relatively to the supporting members 3 during normal use of the switch.

The RF MEMS switch further comprises electrostatic actuating means that are used for bending the membrane 6 and that are formed by two lateral buried electrodes 7. In the preferred embodiment of FIGS. 1 to 3, the buried electrodes are advantageously disposed outside the coplanar wave guide (CPW) under the two plates 6b of the switch membrane 6. The top surface of each electrode 7 is covered by a dielectric layer 8 in order to avoid any ohmic contact between the membrane plates 6b and the electrodes 7. The dielectric layers 8 can be replaced by any other equivalent means that enable to avoid an ohmic contact between the membrane plates 6b and the electrodes 7.

Off-state

FIG. 1 is showing the off-state configuration of the RF MEMS switch. In this off-state configuration, no electric actuation signal is applied on the electrodes 7.

In the off-state, the switch membrane 6 is at rest and is in contact with the dielectric layer 5. The signal line 4 is opened and can not transmit any RF signal within the coplanar guide (CPW).

Preferably, a DC signal is applied on the central supporting member 4 in order to exert a small electrostatic force (F1) on the membrane 6 and maintain a perfect contact between the membrane 6 and the dielectric layer 5. The said off-state DC voltage can be advantageously very low (low consumption).

This biasing DC signal is also useful in case there would be a very small initial gap between the electric layer 5 and the membrane 6 when the membrane is at rest. In such a case, the voltage of the biasing DC signal has to be sufficient in order to exert a contact force F1 (FIG. 1) on the central part of the membrane 6 that is higher than the opposite rest force of the membrane.

In the off-state position, the membrane 6 is advantageously supported in a stable position by the three supporting members 3,4, and is thus less sensible to mechanical vibrations or shocks in comparison with RF MEMS switches that use a stress-free rigid switch beam (publication EP 1 489 639).

Preferably, when the membrane 6 is in the off-state position there is still a small gap between the plates 6b and the bridge parts 3a of the lateral supporting members 3 [FIG. 3—dimensions (d)]. Hence, the supporting members 3 only vertically supports the membrane 6 (direction Z of FIG. 1) and do not exert any mechanical force onto the membrane in plane (X,Y). There is thus no mechanical stress induced in the membrane 6 by the lateral supporting members 3 when the membrane 6 is in the off-state position.

On-state

FIG. 2 is showing the on-state configuration of the RF MEMS switch. In this on-state configuration, the membrane 6 is bended away from the substrate 1, and is no longer in contact with the dielectric layer 5; the RF signal line can be used for transmitting a RF signal.

In this bending state, the membrane stiffness in the out-of-plane direction is increased, which in turns increases the resistance of the switch membrane 6 to vibrations or shocks.

From off-state to on-state

To achieve the on-state configuration, a DC signal is applied on the electrodes 7, in order to create electrostatic forces (F2) between the electrodes 7 and the membrane plates 6b. Said electrostatic forces F2 in combination with the lateral supporting members 3 causes the bending of the membrane (FIG. 2) in such a way that the central part 6a of the membrane 6 is moved away from the dielectric layer 5 (closing of the RF signal line).

It has to be underlined that during this switching movement of the membrane 6 (and also during the reverse switching movement from the on-state to the off-state), the membrane 6 is totally free to slide relatively to the supporting members 3, within the passages 3b of the said supporting members 3.

Thanks to this free movement of the membrane 6 during the switching operations, there is less mechanical stress induced in the membrane 6 by the supporting members 3, in comparison with the RF switches of the prior art wherein the membrane (bridge or cantilever) is clamped onto a supporting structure. Mechanical fatigue and creep due to cyclic stresses in the extremities of the membrane 6 are avoided, and the membrane life time is thus advantageously increased in comparison with RF MEMS switches of the prior art using a membrane that is clamped on the substrate.

Due to the fact that the membrane 6 is free to move relatively to the supporting members, when the RF MEMS switch is submitted to temperature variations, the expansion and relaxation of the switch membrane 6 does not provoke an additional bending of the membrane. The RF MEMS switch of the invention is thus advantageously not temperature-dependant, in contrast with RF MEMS switches of the prior art using a membrane that is clamped on the substrate Furthermore, thanks to the use of a totally free membrane 6, the structure does not depend on the substrate (wafer) curvature. In particular small deformations of the substrate 1 can occur, for example under thermal variations or other mechanical constraints or during the fabrication process, without impairing the switching operations. The RF MEMS switch of the invention it thus advantageously less sensible to substrate deformation, in comparison with RF MEMS switches of the prior art using a membrane that is clamped on the substrate.

Generally, in a capacitive RF MEMS switch, it happens frequently that the switch element sticks to the dielectric layer in the off-state, due to moisture or electrostatic charging of the dielectric layer. For the switch of the invention, thanks to the use of an actuation force (electrostatic forces F2) for moving the membrane 6 towards the on-state position, the sticking problem of the membrane onto the dielectric layer 5 is solved.

From on-state to off-state

When the DC on-state actuation signal on the electrodes 7 is lower than a predetermined threshold (pull-out voltage), electrostatic actuation forces F2 are no longer applied onto the extremities (plates 6b) of the membrane 6, and the membrane 6 is bended back in the off-state position of FIG. 1. The movement of the membrane 6 from the on-state position (FIG. 2) to the off-state position (FIG. 1) is caused by the restoring force of the membrane 6, due to the natural stiffness of the membrane 6.

Thanks to the use of the natural stiffness of the membrane, the movement from the on-state position to the off-state position is very fast and does not require high electric energy. The switching time (from the on-state to the off-state in case of the particular embodiment of FIGS. 1 to 3) of the RF MEMS switch of the invention is thus very short and requires no electric energy in comparison with RF MEMS switches that use a stress-free rigid switch beam (publication EP 1 489 639).

FIG. 4/manufacturing process

The RF MEMS switch of FIGS. 1 to 3 can be manufactured by using conventional surface micromachining technologies (i.e. by depositing and patterning several layers onto a wafer).

FIG. 4 shows the RF MEMS switch just after the fabrication process and before the releasing step. Three sacrificial 9, 10 et 11 layers are being used. Theses sacrificial layers can be made of any material (metal, polymer, dielectric material).

One first sacrificial layer 9 is used for depositing the membrane 6 onto the dielectric layer 2. Once this sacrificial layer 9 is removed in the final releasing step, the two plates 6b of the membrane 6 and the part of the membrane 6 extending between the lateral supporting members 3 are released. The other sacrificial layers 10 and 11 are used for releasing the membrane 6 from the dielectric layer 5, and from the lateral supporting members 3 (ground lines).

During the fabrication process, the distance between the membrane 6 and the dielectric layer 5 (i.e. thickness of the sacrificial layer 10) is very short. Typically, this distance is less than 0.1 μm. This advantageously involve that the profiles for the membrane 6 and the dielectric layer 5 are the same. Since in the off-state the membrane 6 is at rest and is not deformed, and the profile of the membrane 6 is the same than the profile of the dielectric layer 5, then a perfect surface-to-surface contact is obtained between the membrane and the dielectric layer 5 in the off-state position of the membrane 6.

The invention is not limited to the preferred embodiment of FIG. 1 to 3 but can be extend to all RF MEMS switches that comprise a flexible switch membrane that is freely supported onto substrate by supporting members or the like and that is bendable under the action of actuation means.

The actuation means are preferably but not necessarily electrostatic means.

The invention enable to make capacitive RF MEMS switch having very low actuation parameters, very fast switching and improved RF performances. The invention is more particularly and mainly interesting for making capacitive RF MEMS switches that can be used at very high RF signal frequency and notably at RF frequencies over 25 GHz.

The invention is however not limited to capacitive RF MEMS switches but can also be used for making ohmic contact RF MEMS switches (also commonly referred as "metal to metal contact RF MEMS switches"). In an ohmic contact RF MEMS switch of the invention, the flexible and freely supported membrane 6 is for example designed in order to make a short circuit in the on-state position between one first metallic contact positioned between the lateral supporting members 3 and a second metallic contact which can be for example permanently in touch with the membrane 6. In the off-state position, the membrane is no longer in touch with the said first metallic contact.

In case of a capacitive RF MEMS switch, the dielectric layer 5 can be carried by the membrane 6 and not necessarily by the signal line 4. Alternatively, dielectric layers can be carried both by the signal line 4 and the membrane 6.

In the preferred embodiment of FIG. 1 to 3, the actuation electrodes 7 are positioned under the membrane 6 (i.e. between the dielectric layer 2 and the membrane 6) and outside the coplanar wave guide (CPW) formed by the lateral supporting members 3. This particular position of the electrodes involves the following advantages. During the on-state configuration, there is advantageously no risk of interaction between the electrostatic forces (F2) used for actuating the position of the membrane 6 and the RF signal transmitted within the coplanar wave guide. The surface of the electrodes 7 can thus be large, and in turns the "on-state voltage" applied to the electrode 7 can advantageously be very low. This particular position of the electrodes 7 is however only a preferred characteristics of the invention. In another variant of the invention, the RF MEMS switch could be for example designed in such a way that the actuation electrodes 7 are positioned above the membrane 6.

The invention claimed is:

1. RF MEMS switch comprising a substrate and micromechanical switching means that can be actuated between two positions: a first position (off-state) and a second position (on-state), and actuation means for actuating the position of the switching means, wherein the micromechanical switching means comprise a flexible and anchorless membrane which is freely supported above a substrate by support means without being anchored to the support means, which is bendable under the action of the actuation means, and which can freely slide relatively to the support means during its bending movement.

2. The RF MEMS switch of claim 1 wherein the flexible membrane is at rest in one of the two first and second positions, and preferably in the first position (off-state) wherein the switch is opened.

3. The RF MEMS switch of claim 2 further comprising electrostatic means for maintaining the membrane in its rest position.

4. The RF MEMS switch of claim 1 wherein the membrane forms a capacitive switch element.

5. The capacitive RF MEMS switch of claim 4 wherein a first dielectric layer is deposited on a surface of a substrate, wherein it further comprises two metallic supporting members that form a coplanar wave guide with the first dielectric layer, and wherein the membrane is freely supported by the said two metallic supporting members.

6. The capacitive RF MEMS switch of claim 5 wherein each supporting member comprises a passage through which the switch membrane is freely positioned, and the membrane comprises at both extremities two over-dimensioned parts for fastening the membrane to the supporting members, but without hindering the membrane from freely sliding relatively to the supporting members during the switching movements of the membrane.

7. The capacitive RF MEMS switch of claim 5 further comprising a third metallic supporting member, that is positioned between the two metallic supporting members, and that is used as signal line for the RF signal, and wherein at least one second dielectric layer is interposed between the membrane and the third metallic supporting member.

8. The capacitive RF MEMS switch of claim 7 wherein the second dielectric layer is carried by the third metallic supporting member.

9. The capacitive RF MEMS switch of claim 2 wherein the membrane is in contact with a second dielectric layer when the membrane is at rest.

10. The RF MEMS switch of claim 1 wherein the actuation means are electrostatic means.

11. The capacitive RF MEMS switch of claim 5 wherein the actuation means are electrostatic means that comprise two electrodes for bending the membrane away from the substrate, and wherein the two electrodes are positioned on the substrate outside the coplanar wave guide.

12. The capacitive RF MEMS switch of claim 6 further comprising a third metallic supporting member, that is positioned between the two metallic supporting members, and that is used as signal line for the RF signal, and wherein at least one second dielectric layer is interposed between the membrane and the third metallic supporting member.

13. The capacitive RF MEMS switch of claim 8 wherein the membrane is in contact with the second dielectric layer when the membrane is at rest.

14. An RF MEMS switch comprising:
micromechanical switching means that can be actuated between two positions: a first position (off-state) and a second position (on-state);
actuation means for actuating the position of the switching means, wherein the micromechanical switching means comprise a flexible membrane which is a capacitive switch element and is freely supported by support means, which is bendable under the action of the actuation means, and which can freely slide relatively to the support means during its bending movement, wherein a first dielectric layer is deposited on a surface of a substrate; and
two metallic supporting members that form a coplanar wave guide with the first dielectric layer, wherein the membrane is freely supported by the said two metallic supporting members.

15. The capacitive RF MEMS switch of claim 14 wherein each supporting member comprises a passage through which the switch membrane is freely positioned, and the membrane comprises at both extremities two over-dimensioned parts for fastening the membrane to the supporting members, but without hindering the membrane from freely sliding relatively to the supporting members during the switching movements of the membrane.

16. The capacitive RF MEMS switch of claim 14 further comprising a third metallic supporting member, that is positioned between the two metallic supporting members, and that is used as signal line for the RF signal, and wherein at least one second dielectric layer is interposed between the membrane and the third metallic supporting member.

17. The capacitive RF MEMS switch of claim 16 wherein the second dielectric layer is carried by the third metallic supporting member.

18. The capacitive RF MEMS switch of claim 14 wherein the actuation means are electrostatic means that comprise two electrodes for bending the membrane away from the substrate, and wherein the two electrodes are positioned on the substrate outside the coplanar wave guide.

19. The capacitive RF MEMS switch of claim 15 further comprising a third metallic supporting member, that is positioned between the two metallic supporting members, and that is used as signal line for the RF signal, and wherein at least one second dielectric layer is interposed between the membrane and the third metallic supporting member.

20. The capacitive RF MEMS switch of claim 17 wherein the membrane is in contact with the second dielectric layer when the membrane is at rest.

21. An RF MEMS switch comprising:
  micromechanical switching means that can be actuated between two positions: a first position (off-state) and a second position (on-state);
  actuation means for actuating the position of the switching means, wherein the micromechanical switching means comprise a flexible membrane which is freely supported by support means, which is bendable under the action of the actuation means, and which can freely slide relatively to the support means during its bending movement, wherein a first dielectric layer is deposited on a surface of a substrate; and
  two metallic supporting members that form a coplanar wave guide with the first dielectric layer, wherein:
  the flexible membrane is freely supported by the said two metallic supporting members,
  the flexible membrane is at rest in one of the two first and second positions, and preferably in the first position (off-state) wherein the switch is opened, and
  the flexible membrane is in contact with a dielectric layer when the membrane is at rest.

* * * * *

UNITED STATES PATENT AND TRADEMARK OFFICE
CERTIFICATE OF CORRECTION

| | | |
|---|---|---|
| PATENT NO. | : 7,834,722 B2 | Page 1 of 2 |
| APPLICATION NO. | : 11/886684 | |
| DATED | : November 16, 2010 | |
| INVENTOR(S) | : Olivier Millet | |

It is certified that error appears in the above-identified patent and that said Letters Patent is hereby corrected as shown below:

Title Page, No. (73), Assignee, "Villeneuve d'Aseq" should be --Villeneuve d'Ascq--.

Column 1, line 40, after "signal", insert --;--.

Column 1, line 46, "MEMS RF" should be --RF MEMS--.

Column 1, line 56, "MEMS RF" should be --RF MEMS--.

Column 1, line 65, "MEMS RF" should be --RF MEMS--.

Column 3, line 15, "supports" should be --support--.

Column 3, line 26, After "is", insert --a--.

Column 3, line 32, After "figure", insert --1--.

Column 4, line 24, "trough" should be --through--.

Column 5, line 53, After "substrate", insert --.--.

Column 6, line 30, "et" should be --and--.

Column 6, line 43, "involve" should be --involves--.

Column 6, line 51, "FIG. 1 to 3" should be --FIGS. 1 to 3--.

Column 6, line 51, "extend" should be --extended--.

Column 6, line 57, "enable" should be --enables--.

Column 6, line 57, "switch", should be --switches--.

Column 7, line 12, "FIG. 1 to 3" should be --FIGS. 1 to 3--.

Signed and Sealed this

Eleventh Day of October, 2011

David J. Kappos
*Director of the United States Patent and Trademark Office*

CERTIFICATE OF CORRECTION (continued)
U.S. Pat. No. 7,834,722 B2

Column 7, line 22, "turns" should be --turn--.

Column 7, line 25, "characteristics" should be --characteristic--.

Column 7, line 30, Before "RF MEMS" insert --The--.